United States Patent
Lee et al.

(10) Patent No.: US 6,391,769 B1
(45) Date of Patent: May 21, 2002

(54) METHOD FOR FORMING METAL INTERCONNECTION IN SEMICONDUCTOR DEVICE AND INTERCONNECTION STRUCTURE FABRICATED THEREBY

(75) Inventors: Jong-myeong Lee, Sungnam; Hyun-seok Lim, Yongin; Byung-hee Kim, Seoul; Gil-heyun Choi, Sungnam; Sang-in Lee, Suwon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/525,154

(22) Filed: Mar. 14, 2000

Related U.S. Application Data

(63) Continuation-in-part of application No. 09/136,798, filed on Aug. 19, 1998.

(30) Foreign Application Priority Data

Jan. 20, 2000 (KR) .............................................. 00-2700

(51) Int. Cl.$^7$ ..................... H01L 21/4763; H01L 21/44; H01L 23/48; H01L 23/52; H01L 29/40
(52) U.S. Cl. ........................ 438/643; 438/618; 438/624; 438/642; 438/652; 438/653; 257/750; 257/751
(58) Field of Search .................................. 438/618, 642, 438/643, 652, 624, 653; 257/750

(56) References Cited

U.S. PATENT DOCUMENTS 6,001,420 A * 12/1999 Mosely et al. .............. 427/258

OTHER PUBLICATIONS

Wolf, Silicon Processing for the VLSI Era, v.2, 1990, p. 127, 132, 191.*

* cited by examiner

*Primary Examiner*—Charles Bowers
*Assistant Examiner*—Nema Berezny
(74) *Attorney, Agent, or Firm*—Marger Johnson & McCollom, P.C.

(57) ABSTRACT

A method for forming a metal interconnection filling a contact hole or a groove having a high aspect ratio, and a contact structure fabricated thereby. An interdielectric layer pattern, having a recessed region serving as a contact hole, a via hole or a groove, is formed on a semiconductor substrate. A barrier metal layer is formed on the entire surface of the resultant structure where the interdielectric layer pattern is formed. An anti-nucleation layer is selectively formed only on the non-recessed region of the barrier metal layer. The anti-nucleation layer is formed by forming a metal layer overlying the barrier metal layer in regions other than the recessed region, and then spontaneously oxidizing the metal layer in a vacuum. Also, the anti-nucleation layer may be formed by in-situ forming the barrier metal layer and the metal layer and then oxidizing the metal layer by an annealing process. Subsequently, a metal plug is selectively formed in the recessed region, surrounded by the barrier metal layer, thereby forming a metal interconnection for completely filling the contact hole or the groove having a high aspect ratio. A metal liner may be formed instead of the metal plug, followed by forming a metal layer filling the region surrounded by the metal liner, thereby forming a metal interconnection for completely filling the contact hole or groove having a high aspect ratio.

21 Claims, 8 Drawing Sheets

METHOD FOR FORMING METAL INTERCONNECTION IN SEMICONDUCTOR DEVICE AND INTERCONNECTION STRUCTURE FABRICATED THEREBY

CROSS-REFERENCE TO RELATED APPLICATION

This application is a continuation-in-part (CIP) of U.S. patent application Ser. No. 09/136,798 filed Aug. 19, 1998 and assigned to the assignee of the present application, the disclosure of which is hereby incorporated herein by reference in its entirety. The present application is based on Korea Patent Application No. 00-2700, filed Jan. 20, 2000, which is incorporated herein by reference for all purposes.

BACKGROUND OF THE INVENTION

1. Field of the Invention

The present invention relates to a method of manufacturing an integrated semiconductor circuit and an integrated semiconductor circuit fabricated thereby, and more particularly, to a method for forming a metal interconnection and a contact structure fabricated thereby.

2. Description of the Related Art

In general, semiconductor devices include transistors, resistors and capacitors. Metal interconnections are required for interconnecting the semiconductor devices to complete the formation of an integrated circuit. The metal interconnections, which transmit electric signals, must have low electric resistance, and be economical and reliable. Aluminum has been widely used as a material for the metal interconnections.

As semiconductor devices become more highly integrated, the width or thickness of the metal interconnection must be reduced, requiring the size of a contact hole be reduced. As a result, the aspect ratio of the contact hole increases, requiring new methods for completely filling the contact hole with the metal interconnection. A selective chemical vapor deposition (CVD) process has been proposed as a method for completely filling the contact hole having a high aspect ratio with the metal interconnection. The selective CVD process uses the characteristic in which a growth rate of the metal layer on an insulating layer is different from that on a conductive layer.

Conventionally, an interdielectric layer formed on a semiconductor substrate is patterned to form a plurality of contact holes exposing a predetermined area of a lower interconnection interposed between the interdielectric layer and the semiconductor substrate. Then, metal plugs may be formed within the contact holes using the selective CVD process. Here, in the case where at least one of the plurality of contact holes has a depth different from that of the other contact holes, even if all the contact holes have the same diameter, it is difficult to form metal plugs level with the surface of the interdielectric layer in all of the contact holes. In other words, if a metal plug completely filling the deepest contact hole is formed, a metal plug formed within a shallow contact hole will have a protrusion having a height higher than the surface of the interdielectric layer. Therefore, it is difficult to form metal plugs without such a protrusion in a plurality of contact holes having different depths from one another using conventional selective CVD processes.

Also, as the integration density of the semiconductor device increases, the junction depth of a source/drain region of a transistor is reduced. Accordingly, an aluminum layer, used as the metal interconnection, penetrates into the shallow source/drain region, thereby causing a junction spiking phenomenon. To prevent such a junction spiking, a barrier metal layer interposed between the aluminum layer and the source/drain region has been used to suppress the reaction of aluminum atoms of the aluminum layer with silicon atoms of the source/drain region. The barrier metal layer is formed on the entire surface of the resultant structure where the contact holes are formed. Therefore, it is practically impossible to selectively form the metal interconnections only in the contact hole by the selective CVD process since a blanket barrier metal is present on the entire surface of the semiconductor substrate.

SUMMARY OF THE INVENTION

To solve the above problems, the present invention provides a method for forming a metal interconnection capable of selectively forming a metal layer for interconnection uniformly in a contact hole or a groove.

Another objective of the present invention is to provide a contact structure fabricated by the metal interconnection forming method.

According to one embodiment of the present invention for achieving the above objective, an interdielectric layer is formed on a semiconductor substrate. Then, a predetermined region of the interdielectric layer is etched, to form an interdielectric layer pattern having a recessed region. Here, the recessed region may be a contact hole for exposing the predetermined region of the semiconductor substrate or a groove which is shallower than the thickness of the interdielectric layer. The contact hole may be a metal contact hole or a via hole used in a multi-layered metal interconnection technology. When the recessed region is a groove, the metal interconnection is formed through a damascene process. Subsequently, a barrier metal layer, i.e., a titanium nitride (TiN) layer, is formed on the entire surface of the resultant structure where the interdielectric layer pattern is formed. Here, when the recessed region is the metal contact hole for exposing the predetermined region of the semiconductor substrate, i.e., a source/drain region of a transistor, an ohmic metal layer must be formed on the entire surface of the resultant structure where the interdielectric layer pattern is formed, before forming the barrier metal layer. Then, the barrier metal layer is annealed at a predetermined temperature if necessary, to fill the grain boundary region of the barrier metal layer with oxygen atoms. This is for preventing the diffusion of silicon atoms of the semiconductor substrate through the barrier metal layer. Subsequently, an anti-nucleation layer, e.g., an insulating layer, is selectively formed only on the barrier metal layer formed on the non-recessed region, to thereby expose only the barrier metal layer formed on the sidewalls and the bottom of the recessed region. The insulating layer is for selectively forming a metal interconnection only in the recessed region in a process to be performed later. That is, using a characteristic in which the metal layer is not deposited on the insulating layer, the metal layer used for the metal interconnection is formed by the CVD process. Preferably, the insulating layer is one selected from the group consisting of a metal oxide layer, a metal nitride layer, a SiC layer, a BN layer, a SiN layer, a TaSiO layer and a TiSiO layer.

The metal oxide layer can be formed by selectively forming a layer having excellent oxidation characteristics, i.e., a metal layer, only on the barrier metal layer formed on the non-recessed region, and then exposing the metal layer to air or to $O_2$ plasma. Also, the metal oxide layer can be formed by loading and oxidizing the resultant structure in a furnace, where the metal layer has excellent oxidation characteristics. Furthermore, the metal oxide layer can be formed by spontaneously oxidizing the resultant structure having a metal layer having excellent oxidation characteristics in a space having a predetermined degree of vacuum. The metal nitride layer, e.g., an aluminum nitride layer, may be formed by selectively forming an aluminum layer only on the barrier metal layer formed on the non-recessed region, and then exposing the aluminum layer to $N_2$ or $NH_3$ plasma or performing RTP in an atmosphere of $NH_3$ and/or $N_2$.

Alternatively, the anti-nucleation layer, i.e., the metal oxide layer, may be formed by forming a metal layer exposing the barrier metal layer in the metal contact hole on the resultant structure having the barrier metal layer and then annealing the resultant structure having the metal layer. Here, the annealing process is the same as that performed directly after forming the barrier metal layer. Therefore, an oxygen stuffing process performed directly after forming the barrier metal layer can be omitted. Here, the barrier metal layer and the metal layer exposing the barrier metal layer in the contact hole are preferably in-situ formed.

Preferably, a metal layer for forming the metal oxide layer is an Al layer, a Cu layer, a Au layer, a Ag layer, a W layer, a Mo layer, a Ta layer, a Zr layer, a Sr layer, a Mg layer, a Ba layer, a Ca layer, a Ce layer, a Y layer, a Cr layer, a Co layer, a Ni layer or a Ti layer. Also, the metal layer may be a metal alloy film containing one selected from the group consisting of Al, Au, Ag, W, Mo and Ta, and at least one selected from the group consisting of Cu, Si, Ge, Ti and Mg.

The metal layer may be formed through sputtering, a chemical vapor deposition (CVD) or a plating process. Preferably, the CVD process is performed at a temperature range corresponding to a mass transported region instead of a surface reaction limited region and at a pressure of 5 Torr or higher so that the metal layer is not formed in the recessed region. It is preferable that an argon gas and a hydrogen gas are used for a carrier gas and a reducing gas, respectively. The hydrogen gas may be used as a carrier gas. Also, the sputtering process for forming the metal layer is performed such that atoms sputtered from the target lose directionality to prevent the anti-nucleation layer from being formed in the recessed region. That is, it is preferable that the sputtering process for forming the anti-nucleation layer is performed at several mTorr using a DC magnetron sputtering apparatus without a collimator to utilize the poor step-coverage.

Alternatively, the anti-nucleation layer may be formed through a reactive sputtering process. The metal oxide layer may be formed through a $O_2$ reactive sputtering process, and the metal nitride layer, i.e., an aluminum nitride layer, may be formed through a $N_2$ reactive sputtering process.

As described above, the anti-nucleation layer for exposing the barrier metal layer formed in the recessed region has characteristics of the insulating layer, so that a metal layer, i.e., an aluminum layer or a copper layer may be selectively formed in the recessed region. This is because the time required for forming metal nuclei on the anti-nucleation layer being an insulating layer is several tens through several hundreds times longer than the time required for forming metal nuclei on the barrier metal layer being a metal layer. Subsequently, a metal plug for filling a region surrounded by the exposed barrier metal layer, e.g., an aluminum plug, is formed through a selective MOCVD process. The metal plug may be formed of Cu or W instead of Al. Preferably, the aluminum plug is formed through a selective MOCVD process using a precursor containing Al. It is also preferable that the selective MOCVD process for forming the aluminum plug is performed at a temperature corresponding to a surface reaction limited region of aluminum, e.g., at a temperature lower than 300° C. It is preferable that the precursor containing the aluminum is one selected from the group consisting of tri-methyl aluminum (($CH_3)_3Al$), tri-ethyl aluminum (($C_2H_5)_3Al$), tri-iso butyl aluminum ((($CH_3)_2CHCH_2)_3Al$), di-methyl aluminum hydride (($CH_3)_2AlH$), di-methyl ethyl amine alane (($CH_3)_2C_2H_5N:AlH_3$), alkyl pyrroridine alane ($R(C_4H_8)N:AlH_3$) and tri-tertiary butyl aluminum (((($CH_3)_3C)_3Al$). Here, R in the alkyl pyrroridine alane ($R(C_4H_8)N:AlH_3$) represents hydrogen or an alkyl of $C_nH_{2n+1}$. In particular, when R is methyl ($CH_3$), the alkyl pyrroridine alane may be methyl pyrroridine alane (MPA). The alkyl pyrroridine alane is a very stable precursor compared to the di-methyl ethyl amine alane. In more detail, the bonding force between Al and N atoms in the alkyl pyrroridine alane is stronger than that between Al and N atoms in di-methyl ethyl amine alane. Since the alkyl pyrroridine alane is easily kept at room temperature compared to the di-methyl ethyl amine alane, the processing reproducibility thereof is excellent. Also, the selective MOCVD process for forming the Al plug uses an argon carrier gas and a hydrogen reducing gas.

Before forming the metal plug, a metal liner may be selectively formed on a surface of the exposed barrier metal layer. Preferably, the metal liner may be one selected from the group consisting of Al, Cu, Au, Ag, W, Mo and Ta. Also, the metal liner may be formed of a metal alloy film containing one selected from the group consisting of Al, Ag, Au, W, Mo and Ta, and at least one selected from the group consisting of Cu, Si, Ge, Ti and Mg. It is preferable that the metal liner, e.g., a Cu liner is formed by a selective CVD process, e.g., selective MOCVD process. The selective MOCVD process for forming the Cu liner is performed using a metal source containing Cu, e.g., $Cu^{+1}(hfac)TMVS$. When the Cu liner is formed, the metal plug and Cu liner are mixed during an annealing process, to thereby form a metal interconnection containing copper. Accordingly, the reliability of the metal interconnection, i.e., an electromigration characteristic thereof is improved.

When the metal plug, i.e., the aluminum plug overgrows, a sharp protrusion may be formed on a surface of the metal plug. This is because the aluminum layer has a face centered cubic (FCC) structure. Accordingly, when the metal plug overgrows, it is preferable that the metal plug is planarized through a sputter etch process or a chemical mechanical polishing (CMP) process. The above-described process is of a process of forming a damascene interconnection. If necessary, the metal interconnection may be formed by additionally forming a metal layer for covering the planarized metal plug, i.e., an aluminum layer, a tungsten layer, a copper layer or an aluminum alloy layer.

According to another embodiment of the present invention for accomplishing the above object, an interdielectric layer pattern having a recessed region, a barrier metal layer pattern and an anti-nucleation layer are formed in the same manner as the first embodiment, thereby exposing the barrier metal layer formed on the sidewalls and bottom of the recessed region. Also, like the first embodiment, an ohmic metal layer may be formed on the entire surface of the resultant structure where the interdielectric layer pattern is formed, before forming the barrier metal layer, and the barrier metal layer may be annealed after forming the barrier metal layer. Then, the metal liner is selectively formed on a surface of the exposed barrier metal layer. Here, the metal liner may be a single metal liner or a double metal liner obtained by sequentially forming first and second metal liners. It is preferable that the single metal liner is a metal layer formed of one selected from the group consisting of Cu, Al, Ag, Au, W, Mo and Ta. Also, the single metal liner may be a metal alloy layer containing one selected from the group consisting of Al, Au, Ag, W, Mo and Ta, and at least one selected from the group consisting of Cu, Si, Ge, Ti and Mg. It is preferable that the first and second metal liners of the double metal liner are a copper liner and an aluminum liner, respectively. The copper liner is formed through a selective MOCVD process using a precursor containing Cu, e.g., $Cu^{+1}$(hfac)TMVS, as a metal source, and the aluminum liner is formed through a selective MOCVD using a precursor containing Al as a metal source. Here, the copper liner and the aluminum liner are formed at temperature ranges corresponding to surface reaction limited regions of Cu and Al, respectively. Preferably, the precursor containing Al is one selected from the group consisting of tri-methyl aluminum (($CH_3)_3Al$), tri-ethyl aluminum (($C_2H_5)_3Al$), tri-iso butyl aluminum ((($CH_3)_2CHCH_2)_3Al$), di-methyl aluminum hydride (($CH_3)_2AlH$), di-methyl ethyl amine alane (($CH_3)_2C_2H_5N:AlH_3$), alkyl pyrroridine alane ($R(C_4H_8)N:AlH_3$) and tri-tertiary butyl aluminum (((($CH_3)_3C)_3Al$).

Subsequently, a metal layer, e.g., an aluminum layer, a W layer, a Cu layer or an Al alloy layer, is formed on the resultant structure where the metal liner is formed, through a combination of CVD and sputtering process. Then, the metal layer is reflowed at 350~500° C. to form a planarized metal layer for completely filling the region surrounded by the metal liner. At this time, the planarized metal layer is changed to a metal alloy layer in which the metal liner, e.g., the Cu liner and the metal layer are mixed during the reflow process. Accordingly, the reliability of the metal interconnection, i.e., an electromigration characteristic, may be improved.

In the above-described embodiments, if the contact hole is a via hole exposing a lower metal interconnection, at least one of a wetting layer and a barrier metal layer is formed over the entire surface of the semiconductor substrate having the via hole. Subsequently, an anti-nucleation layer exposing the inside of the via hole is formed on the semiconductor substrate where at least one of a wetting layer and a barrier metal layer has been formed, and an upper metal interconnection filling the inside of the exposed via hole is formed. Here, in the case where the lower metal interconnection is formed of W and the upper metal interconnection is formed of Al or Al alloy, the barrier metal layer is necessarily formed. This is because contact failure such as an increase in via resistance occurs when the W layer and the Al layer react with each other. The wetting layer is preferably formed of Ti or Ta. The upper metal interconnection is formed by forming a metal liner and/or a metal plug in the same manner as either of the above-described embodiments of the present invention, forming a metal layer such as an Al layer or an Al alloy layer on the entire surface of the resultant structure by a physical vapor deposition (PVD) process, and reflowing the resultant structure having the metal layer.

To achieve another objective, the present invention provides a contact structure including a first conductive layer formed on a semiconductor substrate, an interdielectric layer pattern which is formed over the entire surface of the semiconductor substrate having the first conductive layer and which exposes a predetermined region of the first conductive layer, an anti-nucleation layer which is formed on the top surface of the interdielectric layer pattern and which exposes the contact hole, and a second conductive layer which is formed on the anti-nucleation layer and which fills the contact hole.

The anti-nucleation layer is an insulator layer such as an oxide layer or a nitride layer. The oxide layer may be a metal oxide layer or a silicon oxide layer, and the nitride layer may be a metal nitride layer or a silicon nitride layer. The metal oxide layer is a material layer produced by oxidizing a metal layer having excellent oxidation characteristics, for example, an Al oxide layer, a titanium oxide layer, a tantalum oxide layer, a zirconium oxide layer, a chrome oxide layer, a cobalt oxide layer or a nickel oxide layer. Also, the metal nitride layer may be an insulator layer such as an Al nitride layer.

A conductive layer may be further provided between the anti-nucleation layer and the interdielectric layer pattern. The conductive layer is a partially remaining metal layer for forming the anti-nucleation layer, and may be an Al layer, a Ti layer, a Ta layer, a Y layer, a Zr layer, a Cr layer, a Co layer or a Ni layer.

In the case where the first conductive layer is a lower metal interconnection formed of metal such as Al, Al alloy or W, the contact hole is a via hole. Here, a conformal metal layer is interposed between both the anti-nucleation layer and the interdielectric layer pattern and between the bottom and side walls of the contact hole and the second conductive layer. The conformal metal layer may have a structure in which the wetting layer and the barrier metal layer are sequentially stacked, or may be a single metal layer consisting of either the wetting layer or the barrier metal layer. In the case where the contact hole is a via hole, both the first and second conductive layers may be copper layers. Here, the conformal metal layer preferably includes at least a barrier metal layer. This is because copper atoms contained in the copper layer are susceptible to diffusion into the interdielectric layer pattern when the copper layer contacts the interdielectric layer pattern.

Also, in the case where the first conductive layer is an impurity layer, a doped polysilicon layer or a refractory metal silicide layer, the contact hole may be a metal contact hole. In this case, a conformal metal layer is interposed between both the anti-nucleation layer and the interdielectric layer pattern and between the bottom and sidewalls of the contact hole and the second conductive layer. The conformal metal layer has a structure in which an ohmic metal layer and a barrier metal layer are sequentially stacked. In the case where the contact hole is a metal contact hole, the second conductive layer may be a copper layer. Here, the conformal metal layer preferably includes at least a barrier metal layer.

According to the present invention, the anti-nucleation layer is selectively formed only on the barrier metal layer formed on the non-recessed region, thereby selectively forming the metal plug or the metal liner in the recessed region and further form the metal interconnection for completely filling a contact hole and a groove having a high aspect ratio.

BRIEF DESCRIPTION OF THE DRAWING

The above objects and advantages of the present invention will become more apparent by describing in detail a preferred embodiment thereof with reference to the attached drawings in which.

DESCRIPTION OF THE PREFERRED EMBODIMENTS

Figure 1:
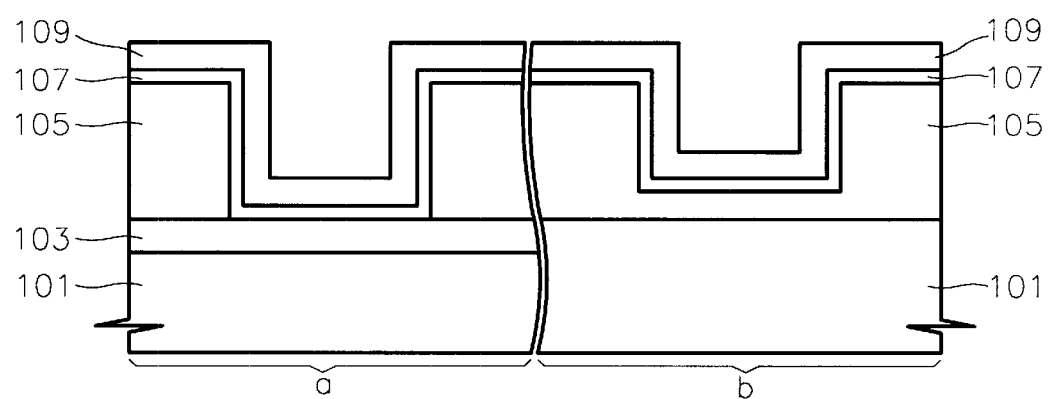
FIGS. 1 through 5 are sectional views for illustrating a method for forming a metal interconnection according to one embodiment of the present invention.

The present invention substantially relates to a method for completely filling a contact hole or an interconnection line with a metal material and an interconnection structure formed thereby. In particular, in the case where at least one of the plurality of interconnection regions, for example, contact holes or interconnection lines, has a depth different from that of the other interconnection regions, the present invention provides an interconnection structure having good morphology characteristics and step coverage characteristics by a combination of a physical vapor deposition process and a chemical vapor deposition process.

In FIGS. 1 through 5, reference character 'a' indicates a contact hole region, and reference character 'b' indicates a groove region where a damascene metal interconnection is formed. In the drawings, the thickness of layers and regions are exaggerated for clarity.

FIG. 1 is a sectional view for illustrating a step of forming an interdielectric layer pattern 105 having a recessed region and a barrier metal layer 109. Here, the recessed region may be a contact hole for exposing a predetermined region of a semiconductor substrate, i.e., an impurity layer, or a groove having a depth which is less than the thickness of the interdielectric layer.

In the step of forming the contact hole, an impurity layer 103 doped with an N-type or P-type impurity is formed on a surface of contact hole region 'a' of the semiconductor substrate 101. An interdielectric layer, i.e., a borophosphosilicate glass layer or an undoped silicon oxide layer, is formed on the entire surface of the resultant structure where the impurity layer 103 is formed. Subsequently, the interdielectric layer on the contact hole region 'a' is etched to form a contact hole, that is, a metal contact hole, for exposing the impurity layer 103.

A groove for forming the damascene interconnection is formed by etching the interdielectric layer on the groove region 'b' to a predetermined depth. The depth of the groove in the region b is less than the depth of the groove in the region. By forming the contact hole or the groove, an interdielectric layer pattern 105 having a recessed region on its surface is formed.

Next, an ohmic metal layer 107 and a barrier metal layer 109 are sequentially formed on the entire surface of the resultant structure where the recessed regions are formed. It is preferable that the ohmic metal layer 107 and the barrier metal layer 109 may be a titanium layer and a titanium nitride layer, respectively. Also, the ohmic metal layer 107 and the barrier metal layer 109 may be a tantalum layer and a tantalum nitride layer, respectively. Moreover, the ohmic metal layer 107 may be a titanium layer or a tantalum layer, and the barrier metal layer 109 may be a TiAlN layer, a TaAlN layer, a TiSiN layer or a TaSiN layer.

Subsequently, the barrier metal layer 109 is treated at a predetermined temperature, to fill a grain boundary region of the barrier metal layer with oxygen atoms, which is known as a stuffing process. Metal atoms of the ohmic metal layer 107 react with silicon atoms of the impurity layer 103 to form a metal silicide layer.

When the barrier metal layer 109 is annealed, the contact resistance is improved due to a metal silicide layer formed between the impurity layer 103 and the barrier metal layer 109. The diffusion of silicon atoms in the impurity layer 103 and the diffusion of aluminum atoms in the metal layer, which causes problems such as junction spiking, may be suppressed by the stuffed barrier metal layer 109. Accordingly, in the case of forming only a damascene interconnection, a process of forming the ohmic metal layer 107 and a process of annealing the barrier metal layer 109 can be omitted.

The process of annealing the barrier metal layer 109 is performed at 400~550° C. in a $N_2$ atmosphere for 30–60 minutes, or at 550~850° C. in a $NH_3$ atmosphere through rapid thermal processing (RTP). Preferably, the RTP is performed for 10–120 seconds. Also, the RTP may be performed in $N_2$ atmosphere, rather than in $NH_3$ atmosphere.

Figure 2:
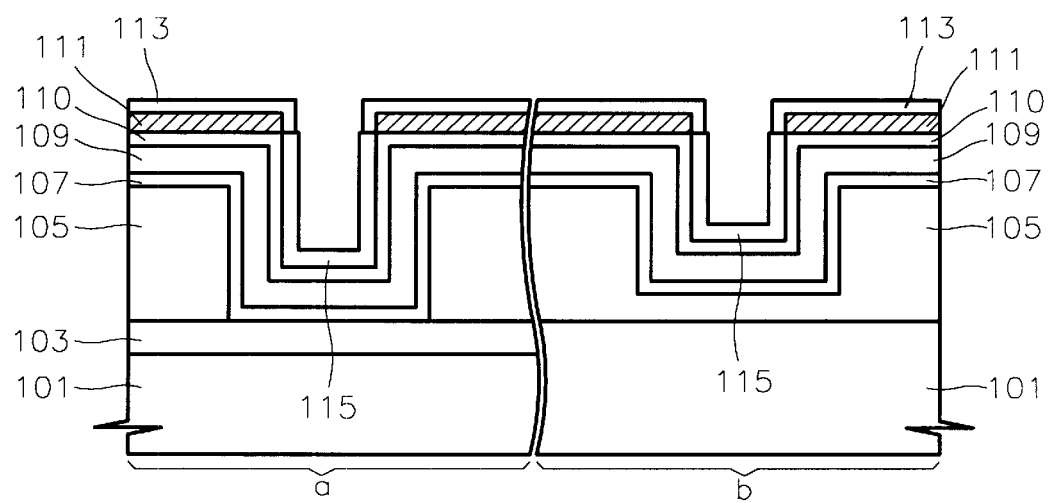

FIG. 2 is a sectional view for illustrating a step of forming a copper layer 110, an anti-nucleation layer 113 and a metal liner 115. In detail, the copper layer 110 is formed on the entire surface of the annealed barrier metal layer 109 to a thickness of 10~300 Å. Subsequently, a material layer 111 having a thickness of 20~300 Å, obtained through a physical vapor deposition process, (a sputtering process), i.e., an aluminum layer, a titanium layer or a tantalum layer, is formed on the resultant structure where the copper layer 110 is formed. It is preferable that the material layer 111 is formed using a DC magnetron sputtering apparatus without collimator. Also, it is preferable that the DC magnetron sputtering process is performed at 10~30° C. and at a pressure of 3~10 mTorr.

When the material layer is formed using the DC magnetron sputtering apparatus having no collimator at 3~10 mTorr, or more preferably, 5~10 mTorr, the directionality of the sputtered metal atoms is lost, to thereby prevent formation of the material layer in the recessed region. Accordingly, as shown in FIG. 2, the material layer 111, i.e., the metal layer, is selectively formed only on the interdielectric layer pattern 105, leaving the copper layer 110 formed in the recessed region exposed. The semiconductor substrate is cooled to a temperature corresponding to that of a surface reaction limited region, i.e., 10~30° C. (in the aluminum layer), or preferably, 25° C., to thereby form an aluminum layer.

When the material layer is formed at a low temperature, the material layer having a uniform thickness may be obtained even when an ultra thin film of 20 Å or less is formed. Alternatively, the material layer 111 may be formed through a chemical vapor deposition process. It is preferable that the material layer 111 is a metal layer, having excellent oxidation characteristics, e.g., an aluminum (Al) layer, a titanium (Ti) layer, or a tantalum (Ta) layer. It is preferable to use a chemical vapor deposition process for forming the material layer 111 at a temperature corresponding to that of a mass transported region instead of the surface reaction limited region and a pressure of 5 Torr or higher, to prevent formation of the material layer 111 in the recessed region. For example, in the case that the material layer 111 is the aluminum layer through the chemical vapor deposition process, when the aluminum layer is formed at a temperature range corresponding to that of the mass transported region of aluminum, i.e., approximately 180° C. or higher, the aluminum layer may be prevented from being formed in the recessed region. It is preferable that argon and hydrogen are used for a carrier gas and a reducing gas, respectively.

As the aspect ratio of the recessed region increases, the effectiveness of selectively forming the material layer 111 only on the interdielectric layer pattern 105 increases. Accordingly, as increased integration of semiconductor devices requires a recessed region to have a high aspect ratio, the material layer 111 may be more selectively formed. Preferably, the aluminum layer used as the material layer 111 is formed to a thickness of 25~300 Å. The process of forming the copper layer 110 may be omitted in some embodiments. In that case, the material layer 111 is selectively formed only on the barrier metal layer 109 on the interdielectric layer pattern 105. The barrier metal layer 109 formed in the recessed region is exposed. Then, the resultant structure where the material layer 111 is formed is exposed to air or oxygen plasma; oxidizing the material layer 111, to thereby form an anti-nucleation layer 113, i.e., an aluminum oxide ($Al_2O_3$) layer, a titanium oxide ($TiO_2$) layer or a tantalum oxide ($Ta_2O_5$) layer. When the material layer 111 is oxidized by exposure to air, as shown in FIG. 2, a part of the material layer 111 may be changed to the anti-nucleation layer 113.

Also, the anti-nucleation layer 113 may be formed by oxidizing the material layer 111 in a vacuum. In detail, the semiconductor substrate having the barrier metal layer 109 or the copper layer 110 is loaded into a predetermined process chamber of the PVD apparatus or the CVD apparatus.

Figure 10:
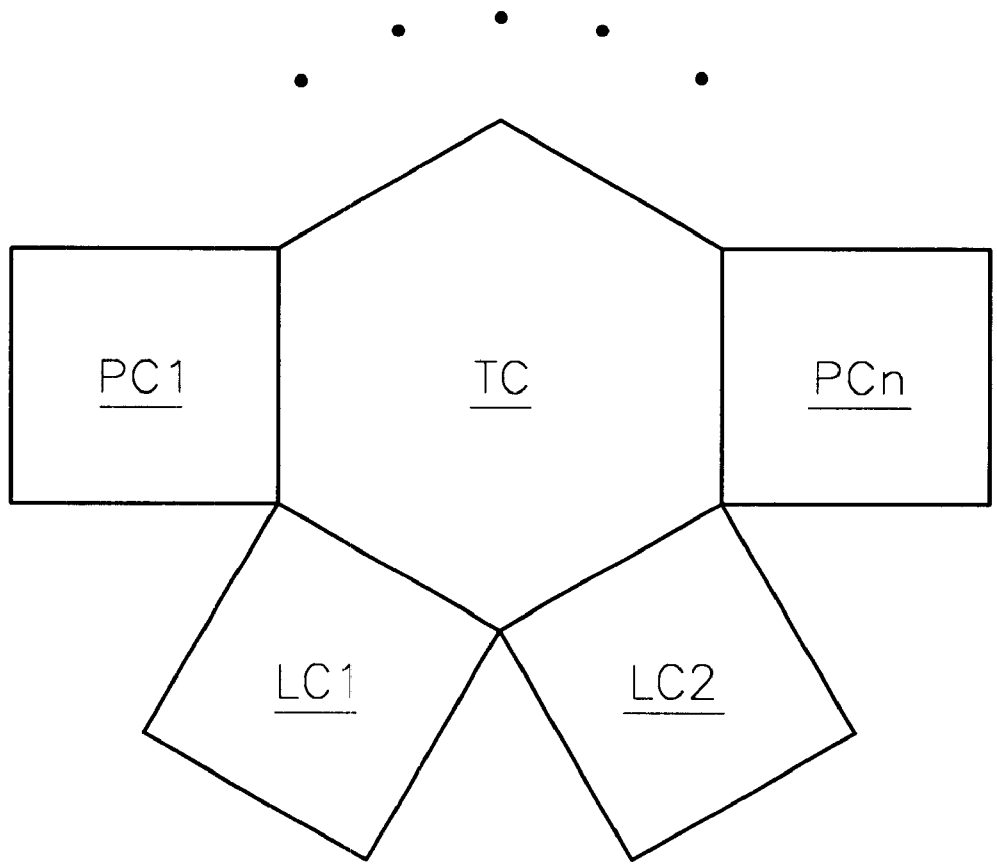
FIG. 10 is a schematic diagram of a physical vapor deposition (PVD) apparatus or a chemical vapor deposition (CVD) apparatus.

Here, the PVD apparatus or the CVD apparatus includes a transfer chamber (TC), a plurality of process chambers (PC1, . . . , PCn), and two load lock chambers (LC1 and LC2), as shown in FIG. 10. Of the two load lock chambers LC1 and LC2, the first load lock chamber LC1 may be an input load lock chamber and the second load lock chamber LC2 may be an output load lock chamber. The material layer 111 is formed on the semiconductor substrate loaded into the predetermined process chamber, for example, the first process chamber PC1.

At this stage, the material layer 111 is formed under a condition of poor step coverage such that the material layer 111 does not cover the barrier metal layer 109 or the copper layer 110 in the recessed region. Here, the material layer 111 is preferably formed by a DC magnetron sputtering apparatus without a collimator or a CVD apparatus at a temperature corresponding to that of a mass transported region. The material layer 111 is preferably a metal layer, having excellent oxidation characteristics, for example, an Al layer, a Ti layer, a Ta layer, a Zr layer, a Sr layer, a Mg layer, a Ba layer, a Ca layer, a Ce layer or a Y layer.

Subsequently, the semiconductor substrate having the material layer 111 is carried from the first process chamber PC1 to another process chamber, e.g., the second process chamber PC2, for performing a subsequent process. Here, the semiconductor substrate is carried via the transfer chamber TC. Thus, in a state where the semiconductor substrate having the material layer 111 is carried from the first process chamber PC1 to the transfer chamber TC, the surface of the material layer 111 can be spontaneously oxidized by appropriately adjusting the vacuum level of the transfer chamber TC.

It is generally known that a stable oxide layer is formed on the surface of a metal layer having strong oxidation characteristics such as an aluminum layer even in an ultra high vacuum level of about $10^{-100}$ Torr. For example, it takes several tens of seconds for a native oxide film to be formed on the surface of the Al layer under a vacuum state of $10^{-8}$ Torr. Also, it takes only several seconds for a native oxide film to be formed on the surface of the Al layer under a vacuum state of $10^{-7}$ Torr. Therefore, if the semiconductor substrate having the material layer 111, e.g., the Al layer, is transferred into the transfer chamber TC and temporarily kept therein for several seconds in a state where the vacuum level of the transfer chamber TC is maintained at $10^{-8}$ Torr to one atmosphere, preferably about $10^{-7}$ Torr, a native aluminum oxide film of a single atomic layer is formed on the surface of the Al layer. Accordingly, the anti-nucleation layer 113 can be formed without performing an extra process of exposing the semiconductor substrate having the material layer 111 to the air or oxygen plasma.

In one embodiment, the anti-nucleation layer 113 may be formed by in-situ forming the barrier metal layer 109 and the material layer 111 in one apparatus and then performing a predetermined annealing process. The predetermined annealing process is performed in the same manner as that shown in FIG. 1, that is, the annealing process performed directly after forming the barrier metal layer 109. In other words, the predetermined annealing process is performed at 400~550° C. in a $N_2$ atmosphere for 30–60 minutes, or at 550~850° C. in a $NH_3$ atmosphere through rapid thermal processing (RTP). The RTP is, preferably, performed for 10–120 seconds. Also, the RTP may be performed in an $N_2$ atmosphere, rather than in the $NH_3$ atmosphere. Here, while performing the predetermined annealing process, the material layer 111 is then oxidized to form the anti-nucleation layer 113 and to simultaneously fill the grain boundary region of the exposed barrier metal layer 109 in the recessed region with oxygen atoms.

In the case where the material layer 111 is an Al layer, a Ta layer or a Ti layer, the anti-nucleation layer 113 may be an aluminum oxide layer ($Al_2O_3$), a tantalum oxide layer ($Ta_2O_5$) or a titanium oxide layer ($TiO_2$). Thus, since such an extra annealing process as shown in FIG. 1, that is, the annealing process performed directly after forming the barrier metal layer 109, is not required, the process can be simplified.

In another embodiment, the anti-nucleation layer 113 may be formed of aluminum nitride (AlN) if the material layer 111 is formed of aluminum. The aluminum nitride layer may be formed by exposing the resultant structure, where the aluminum layer is selectively formed only on the non-recessed region of the interdielectric layer pattern 105, to $N_2$ plasma or by performing Rapid Thermal Processing (RTP) on the resultant structure in an atmosphere of $NH_3$. It is preferable that the RTP for forming the aluminum nitride layer is performed at 500~850° C. for 30~180 seconds. When the aluminum layer is nitrided to form the anti-nucleation layer 113, the effect of annealing the barrier metal layer 109 in the recessed region is obtained, thereby strengthening the characteristics of the barrier metal layer 109.

Further, the anti-nucleation layer 113, e.g., an aluminum oxide layer, an aluminum nitride layer, a titanium oxide layer or a tantalum oxide layer, may be formed through an $O_2$ reactive sputtering process or $N_2$ reactive sputtering process. In detail, the anti-nucleation layer 113 having a thickness of 20~200 Å is formed on the resultant structure where the barrier metal layer 109 is formed or where the barrier metal layer 109 and the copper layer 110 are formed, through the reactive sputtering process using radio frequency power (RF power). It is preferable that the anti-nucleation layer 113 is formed to a thickness of 100~200 Å when the damascene interconnection is formed. This is because, when a chemical mechanical deposition (CMP) process for planarizing the metal layer is performed in forming the damascene interconnection, the anti-nucleation layer 113 functions as a polishing stopper. It is preferable that the reactive sputtering process is performed at a pressure of 2~8 mTorr. When argon gas and oxygen gas are used for the reaction gas and aluminum target is used for a metal target when performing the reactive sputtering process, the aluminum oxide layer is formed. Similarly, when argon gas and oxygen gas are used for the reaction gas and a titanium target or a tantalum target is used for a metal target, the titanium oxide layer or the tantalum oxide layer is formed. Also, when argon gas and nitrogen gas are used for the reaction gas and the aluminum target is used for the metal target, the aluminum nitride layer is formed.

In yet another embodiment, the anti-nucleation layer 113 may be a SiC layer. The SiC layer is formed through the reactive sputtering process using RF power. The argon gas and $CH_4$ gas are used for the reaction gas and the silicon target is used for the target.

Also, a metal liner 115, i.e., a copper liner, is selectively formed only on a surface of the exposed copper layer 110 or the exposed barrier metal layer 109 to a thickness of less than 10 Å. Here, when the copper layer 110 is formed, the metal liner 115, i.e., the copper liner may not be required. Also, in some embodiments, both the copper layer 110 and the metal liner 115 may not be formed. The copper liner is formed through a selective MOCVD process using $Cu^{+1}$(hfac)TMVS as a metal source. It is preferable that the selective MOCVD process for forming the copper liner is performed at 100 Torr~10 Torr and 150~350° C. The copper layer 110 or the copper liner is formed for improving the reliability of the interconnection including a metal plug to be formed, e.g., an electromigration characteristic of the metal interconnection.

Figure 3:
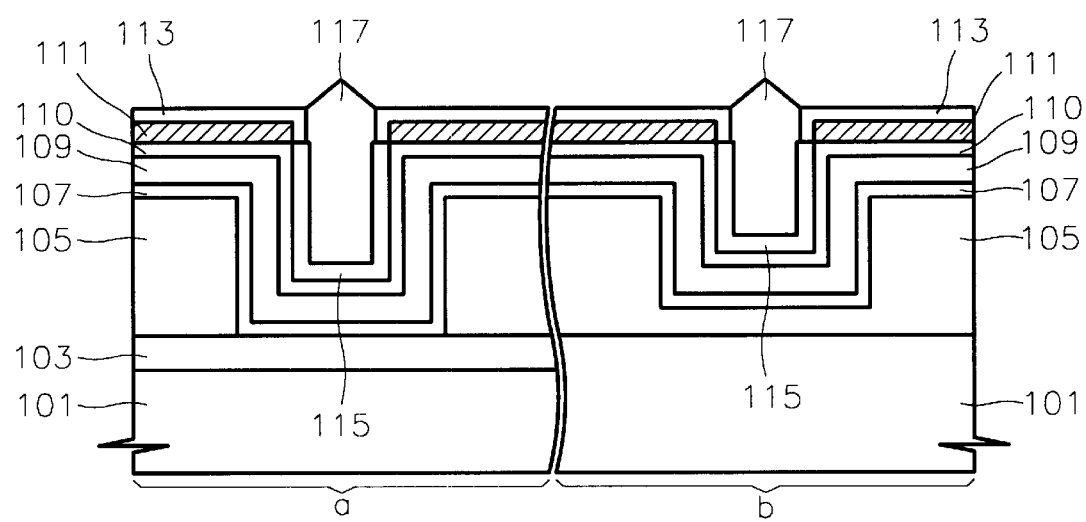

FIG. 3 is a sectional view for illustrating a step of forming a metal plug 117. In detail, the metal plug 117 for filling a region lined with the metal liner 115, e.g., an aluminum plug, is formed through a selective MOCVD process. The selective MOCVD process for forming the aluminum plug is performed using a dimethyl ethyl amine alane (DMEAA) as the metal source, at a deposition temperature of 100~200° C., preferably, 120° C. and 0.5~5 Torr, preferably, 1 Torr. A bubbler, for supplying the DMEAA, the metal source, into a process chamber of the MOCVD apparatus, is maintained at room temperature. In the MOCVD process for selectively forming the aluminum plug, argon gas is used as a carrier gas for transmitting a metal source, and hydrogen gas is used for reducing the metal source. A metal nucleation time on the surface of the insulating layer, i.e., the anti-nucleation layer 113, is tens to hundreds of times longer than that on a surface of an exposed metal liner 115, a copper layer 110 or a barrier metal layer 109, in the recessed region. For this reason, the metal plug 117 is selectively formed only in the recessed region.

Alternatively, the selective MOCVD process for forming the Al plug is performed at a deposition temperature in the range of 120~250° C. using alkyl pyrroridine alane as a metal source. At this stage, the process of inducing the alkyl pyrroridine alane into the selective MOCVD chamber can be performed by using a bubbler, a gas phase mass flow controller (MFC) or a liquid delivery system. In the case of using the bubbler or the gas phase MFC, the alkyl pyrroridine alane must be heated at a temperature higher than room temperature, e.g., at a temperature in the range of room temperature to 50° C. In the case of using the liquid delivery system, the evaporator must be heated at a temperature in the range of 40~100° C. Also, a gas injection tube for inducing the alkyl pyrroridine alane into the chamber is preferably heated at a temperature in the range of 40~120° C. This prevents the alkyl pyrroridine alane from being condensed in the gas injection tube. Argon gas or hydrogen gas is used as a carrier gas for carrying the alkyl pyrroridine alane. In the case of using only the argon gas as the carrier gas, the hydrogen gas may be injected into the chamber for facilitating Al deposition in the chamber through a separate hydrogen injection tube. It is preferable that the thickness of the metal plug 117 be 100~110% of the radius of a hole formed by the metal liner 115, to form the metal plug for completely filling a region lined by the metal liner 115. Here, if the diameter of each contact hole is the same, uniform metal plugs 117 level with the top surface of the interdielectric layer pattern 105 are formed in all the contact holes, irrespective of the depth of each of the contact holes. This is because conductive material layers, such as the barrier metal layer 109, the copper layer 110 or the metal liner 115, are present on the sidewalls of the contact hole as well as on the bottom of the contact hole except the region covered by the anti-nucleation layer 113. That is, metal is simultaneously deposited on the bottom of and on the sidewalls of the contact hole while forming the metal plug 117. Therefore, the selective formation of the metal plug 117 using the anti-nucleation layer 113 is very effective in forming metal plugs level with the top surface of the interdielectric layer pattern 105, in a plurality of contact holes having different depths from one another.

However, in the case where there are plurality of recessed regions having different widths from one another, that is, a plurality of contact holes having different diameters from one another, if the metal plug 117 is formed based on the large diameter recessed region, the metal plug 117 formed on a smaller recessed region excessively grows, forming a protrusion on the surface of the metal plug 117. In particular, when the metal plug 117 is formed of aluminum, as shown in FIG. 3, the protrusion may be formed sharply. This is due to the aluminum layer being formed in a face centered cubic (FCC) structure. The metal plug 117, which is formed of aluminum in the preferred embodiment, may be formed of copper, silver or gold. Also, when a process of forming the copper layer 110 or the copper liner is omitted, it is preferable that the metal plug 117 is formed of aluminum alloy containing copper, e.g., a Al—Si—Cu layer or a Al—Cu layer. In the case of forming the metal plug 117 using the aluminum alloy containing copper, the selective MOCVD process using $Cu^{+1}$(hfac)TMVS and dimethyl ethyl amine alane (DMEAA) as a copper source and an aluminum source, respectively, may be employed for forming the metal plug 117.

Figure 4:
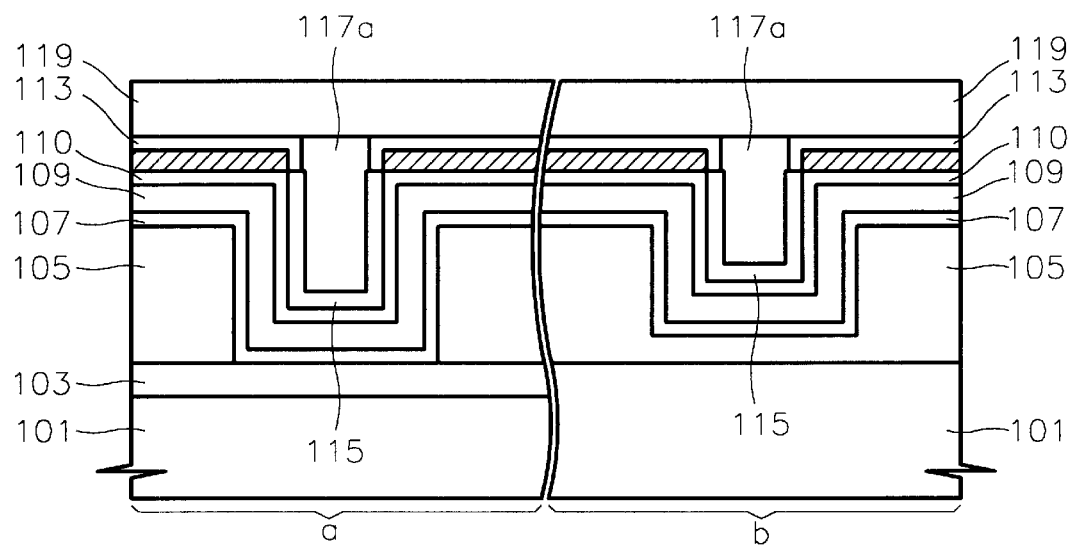

FIG. 4 is a sectional view for illustrating a step of forming a planarized metal plug 117a and an interconnection metal layer 119. In detail, when a protrusion is formed because of the excessively grown metal plug 117, the protrusion of the metal plug 117 is removed to form a planarized metal plug 117a. For this step, a sputter etch process or a chemical mechanical polishing process may be used. Also, the metal plug 117 may be planarized by reflowing the metal plug 117, i.e., an aluminum plug, at 350~500° C., preferably, 450° C., for 30~180 seconds, preferably, 60 seconds. When the metal plug 117 is formed of other metal instead of aluminum, the metal plug is, preferably, reflowed at a temperature of 0.6×Tm or higher. Here, Tm denotes the melting temperature of the metal for forming metal plug 117. A native oxide film must not exist on the surface of the metal plug 117 to perform the reflow process. Accordingly, in the case of forming the metal plug 117 using a cluster apparatus including an MOCVD chamber and a sputter chamber, it is preferable that the metal plug 117 is planarized through a reflow process. This is because the resultant structure where the metal plug 117 is formed can be transmitted to a sputter chamber in a vacuum.

When the copper liner or the copper layer 110 is formed under the metal plug 117, i.e., the aluminum plug, and then the metal plug 117 is planarized through the reflow process, the planarized metal plug 117a, the planarized aluminum plug, includes copper by reaction with a copper liner or a copper layer 110. Accordingly, the reliability of the damascene interconnection composed of the barrier metal layer 109 and the planarized metal plug 117a may be increased. If the metal plug 117 does not grow too large, the step of planarixing the metal plug 117 may be omitted.

In one embodiment of the present invention, a metal layer 119, i.e., an aluminum layer, an aluminum alloy layer or a copper layer, is formed on the entire surface of the resultant structure where the planarized metal plug 117a is formed, at 200° C. or lower. This is for obtaining a smooth surface morphology and a dense film quality.

In further detail, the metal layer 119 may be formed by depositing aluminum or aluminum alloy through a sputtering process at room temperature under a pressure of several mTorr and then reflowing the aluminum or the aluminum alloy at a temperature of 450~500° C. Also, the metal layer 119 may be formed by depositing aluminum or aluminum alloy through a long through sputtering (LTS) process at room temperature under a low pressure of 0.1 to 1 mTorr. At this stage, the LTS process exhibits excellent step coverage without a separate reflow process and collimator, thereby simplifying the process of forming the metal layer 119. In the LTS process, the distance between the target and the substrate is large, compared to the general sputtering process.

Alternatively, the metal layer 119 may be formed through a high-temperature sputtering process or a high-temperature/low pressure sputtering process. In detail, the metal layer 119 may be formed by depositing aluminum or aluminum alloy through a sputtering process at a high temperature of 300~500° C. under a pressure of several mTorr. At this stage, the deposition of aluminum or aluminum alloy and the reflow process are simultaneously performed. Also, the metal layer 119 may be formed by depositing aluminum or aluminum alloy through a sputtering process at a high temperature of 300~500° C. under a low pressure of 0.1 to 1mTorr. Here, the lower the pressure is maintained while performing the sputtering process, the better the step coverage of an Al layer or an Al alloy layer becomes.

Figure 5:
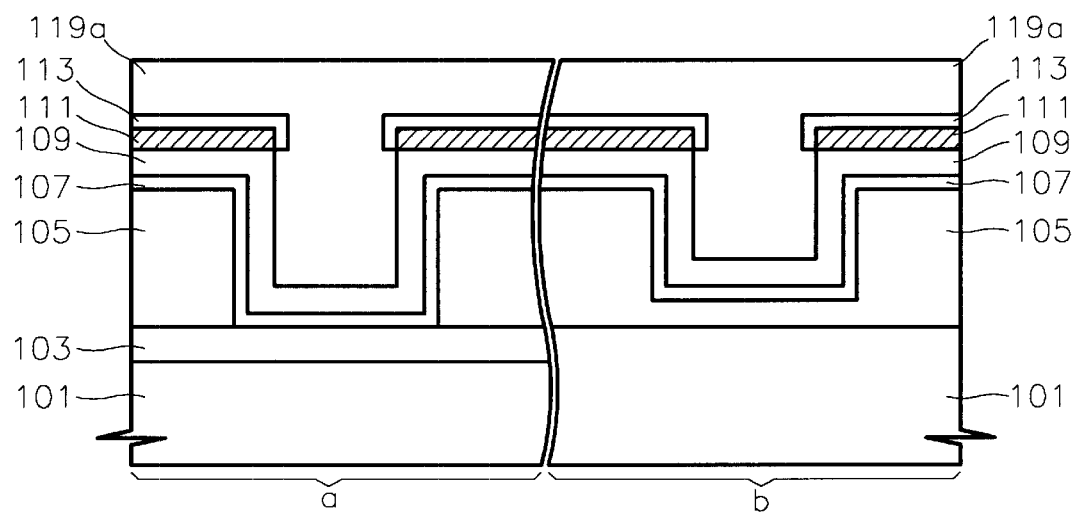

FIG. 5 is a sectional view for illustrating a step of forming a metal alloy layer 119a. The step of forming the metal alloy layer 119a is useful for the case of planarizing the metal plug 117 through the sputter etch process or the CMP process or in the case of omitting the step of planarizing the metal plug 117. In detail, the sputter etch process or the CMP process is performed at 300° C. or lower. Accordingly, the metal plug 117 does not react with the copper layer 110 or the copper liner. When a metal layer 119, i.e., an aluminum layer, is formed on the entire surface of the resultant structure where the metal plug 117 or the planarized metal plug 117a is formed, at 200° C. or lower. Then the aluminum layer is annealed at 350~500° C. As a result, the metal alloy layer 119a, i.e., an aluminum alloy layer containing copper, may be obtained. At this time, the metal layer 119, i.e., the aluminum layer, may be additionally formed at 350~500° C., instead of annealing the metal layer 119.

In FIGS. 6 through 9, reference characters 'a' and 'b' indicate a contact region and a groove region, respectively, as in FIG. 1.

Figure 6:
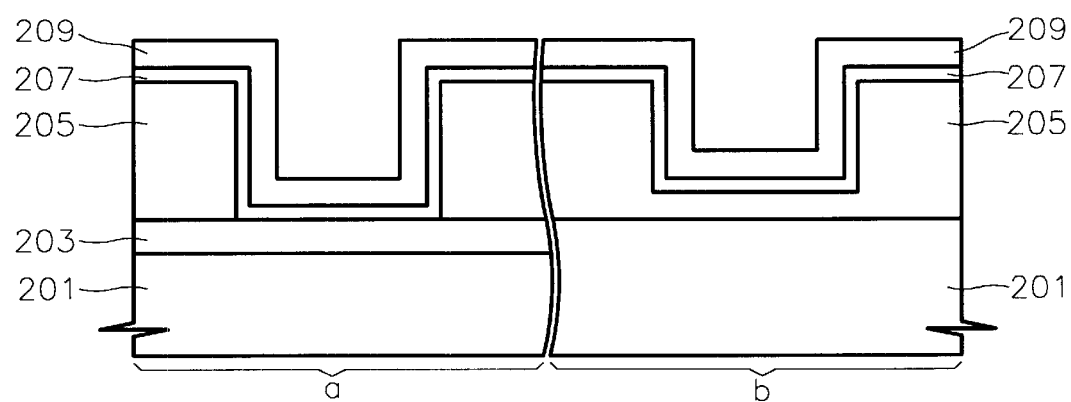
FIGS. 6 through 9 are sectional views for illustrating a method for forming a metal interconnection according to another embodiment of the present invention.

FIG. 6 is a sectional view for illustrating a step of forming an interdielectric layer pattern 205 having a recessed region and a barrier metal layer 209. Here, the recessed region may be a contact hole for exposing an impurity layer 203 or a groove having a depth that is less than the thickness of the interdielectric layer. The step of forming the interdielectric layer pattern 205 having a recessed region, with the barrier metal layer 209 formed thereon, is performed in the same manner as that of the first embodiment. Also, steps of annealing the impurity layer 203 of the contact hole region 'a', an ohmic metal layer 207 and a barrier metal layer 209 are performed in the same manner as that of the first embodiment. In the case of forming the damascene interconnection, the steps of forming the ohmic metal layer 207 and annealing the barrier metal layer 209 may be omitted as in the first embodiment.

Figure 7:
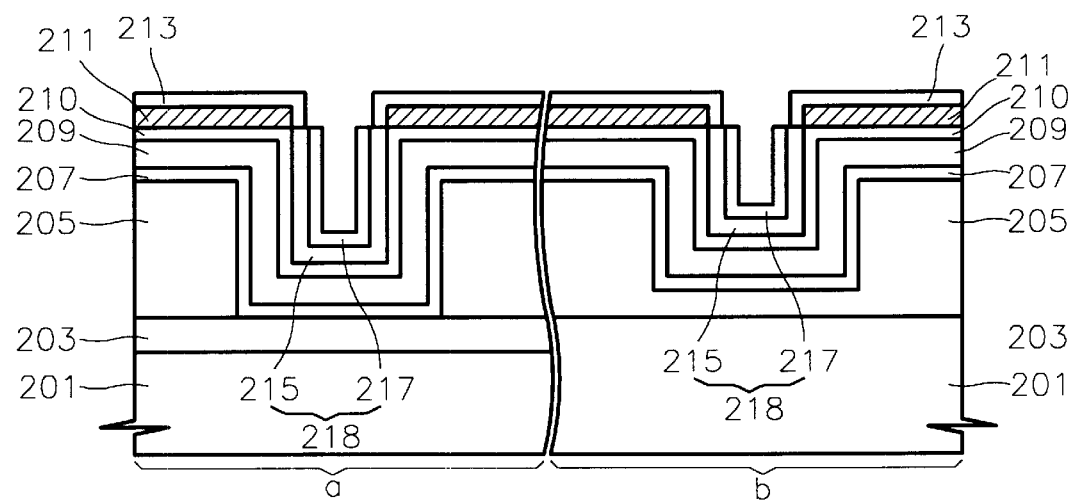

FIG. 7 is a sectional view illustrating a step of forming a copper layer 210, an anti-nucleation layer 213 and a metal liner 218. The copper layer 210 and the anti-nucleation layer 213 are formed in the same manner as the first embodiment described with reference to FIG. 2. In detail, when a material layer 211, selectively formed only on the interdielectric layer pattern 205, is oxidized or nitrided to form the anti-nucleation layer 213, the selectively formed material layer 211 may partially remain as in the first embodiment.

According to the present invention, the metal liner 218 may be a single metal liner, i.e., a copper liner, as in the first embodiment, or a double metal liner obtained by sequentially forming a first metal liner 215 and a second metal liner 217. Here, it is preferable that the first and second metal liners 215 and 217 are a copper liner and an aluminum liner, respectively. The copper liner is formed through the same process as the method described with reference to FIG. 2, i.e., the selective MOCVD process in which $Cu^{+1}$(hfac) TMVS is used for a metal source. The aluminum liner, i.e., the second metal liner 217, is formed through a selective MOCVD process used for forming the metal plug 117 of FIG. 3, i.e., the aluminum plug. However, the thickness of the second metal liner 217 is less than the radius of a hole formed by the first metal liner 215, this being different from the aluminum plug of FIG. 3. Here, either the process of forming the copper layer 210 or the process of forming the first metal liner 215, or both processes, may also be omitted if necessary. The single metal liner may be an Al layer or an Al alloy layer containing copper. In this case, the selective MOCVD process, using $Cu^{+1}$(hfac)TMVS and dimethyl ethyl amine alane (DMEAA) as a copper source and an aluminum source, respectively, may be employed for forming the Al alloy liner.

In accordance with the present invention, the process temperatures for selectively forming the copper liner depend on the material of the lower layer, i.e., the material exposed in the recessed region. For example, when the copper liner is selectively formed on a surface of a titanium nitride layer, it is preferable that the deposition temperature of the copper liner is 0~350° C. Preferably, the copper liner is formed at a pressure of 10 Torr, and the temperature of the metal source, i.e., $Cu^{+1}$(hfac)TMVS is maintained at 40~50° C.

Figure 8:
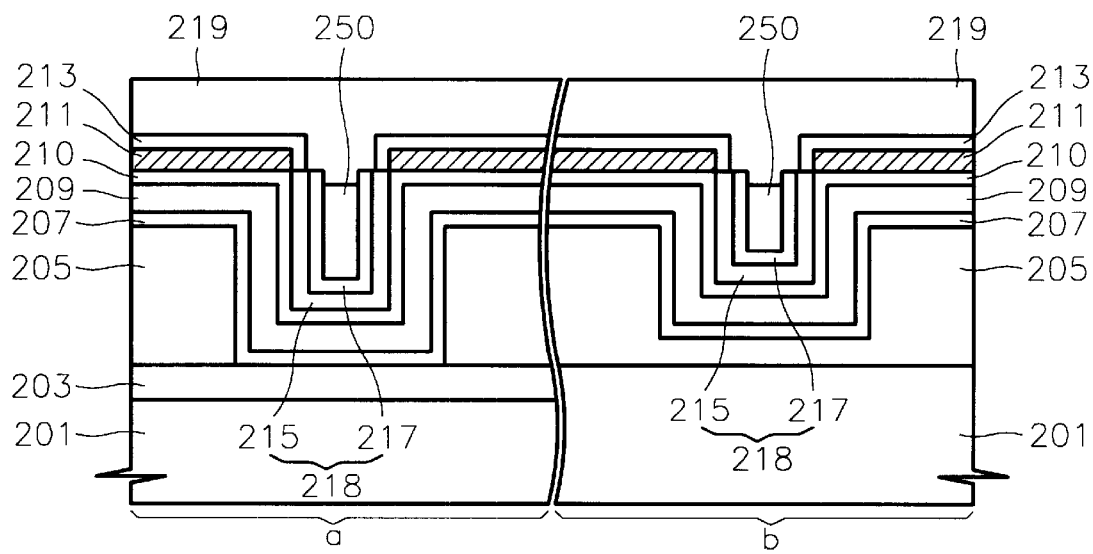

FIG. 8 is a sectional view illustrating a step of forming a metal layer 219. In detail, the metal layer 219, i.e., an aluminum layer or an aluminum alloy layer, is formed on the entire surface of the resultant structure including the metal liner 218, by a sputtering process. It is preferred that the aluminum layer or the aluminum alloy layer is formed at a temperature below the reflow temperature. This prevents the formation of voids in the metal layer, during planarizing of the metal layer 219 through a reflow process. Also, the metal layer 219 may be formed in the same manner as that of forming the metal layer 119 shown in FIG. 4. Here, as shown in FIG. 8, a void 250 may be formed in the recessed region, which is due to an over-hang phenomenon occurring during the sputtering process. However, the void 250 is completely filled with the metal layer 219 during a subsequent reflow process. This is because the metal liner 218 serves as a wetting layer to improve the ability of the metal layer 219 to fill the recessed region.

Figure 9:
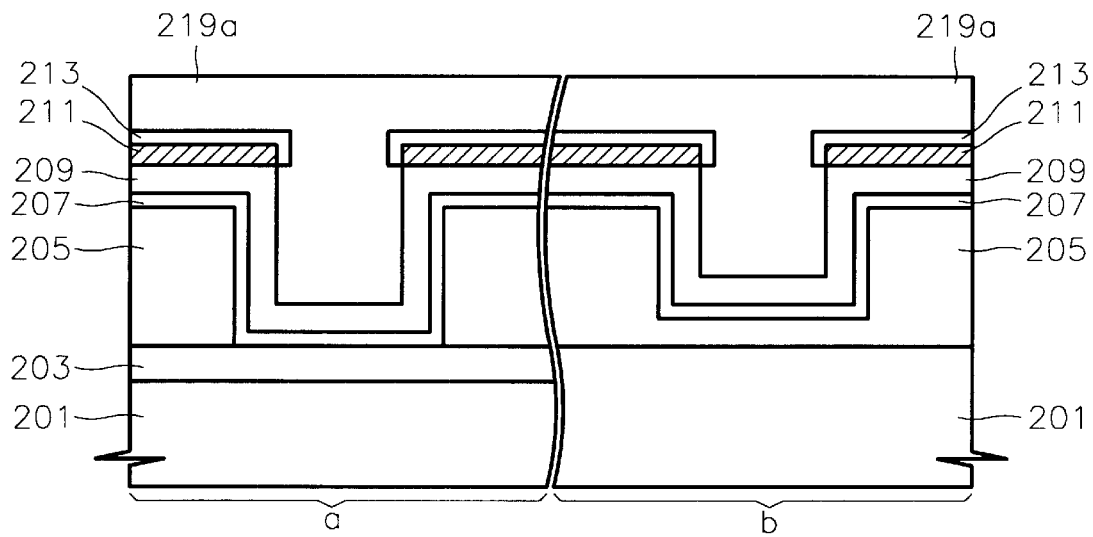

FIG. 9 is a sectional view illustrating a step of forming a planarized metal alloy layer 219a. In detail, the resultant structure including the metal layer 219 is annealed at a predetermined temperature to reflow the metal layer 219. It is preferable that the annealing temperature of the metal layer 219 formed of aluminum or aluminum alloy is 350~500° C. When the metal layer 219 is reflowed by annealing, the metal liner 218 and the metal layer 219 are reacted to form the metal alloy layer 219a having a planarized surface.

In the described second embodiment of the present invention, the process of forming the metal plug during formation of the metal interconnection, as required for the first embodiment, is not required. Accordingly, the process of planarizing the metal plug may be also omitted.

Figure 11:
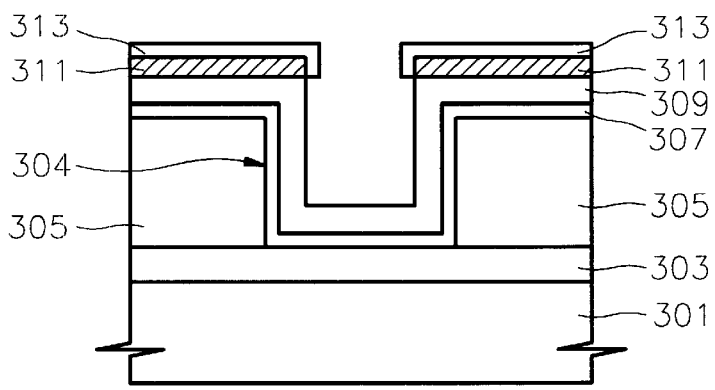
FIGS. 11, 12A, 12B and 13 are sectional views for illustrating a method for forming a metal interconnection according to still another embodiment of the present invention and a contact structure according to the present invention.
Figure 12A:
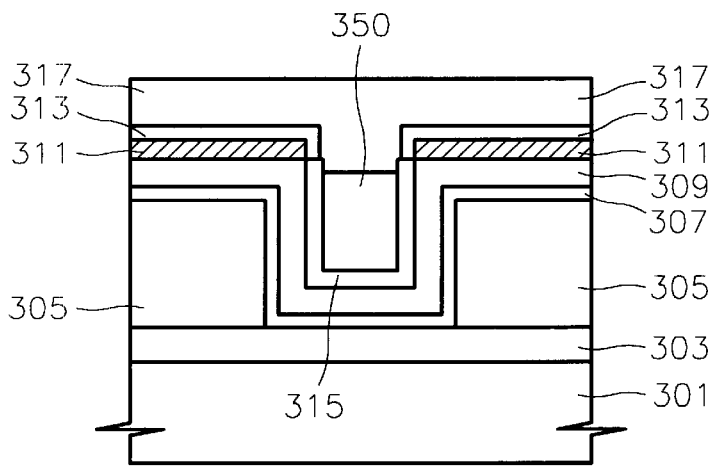
Figure 12B:
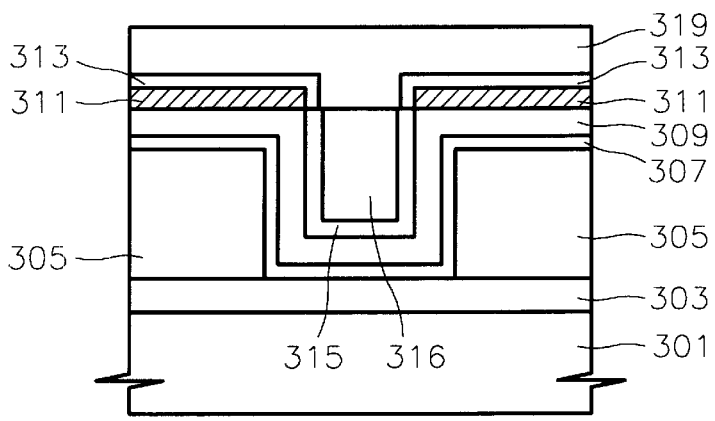
Figure 13:
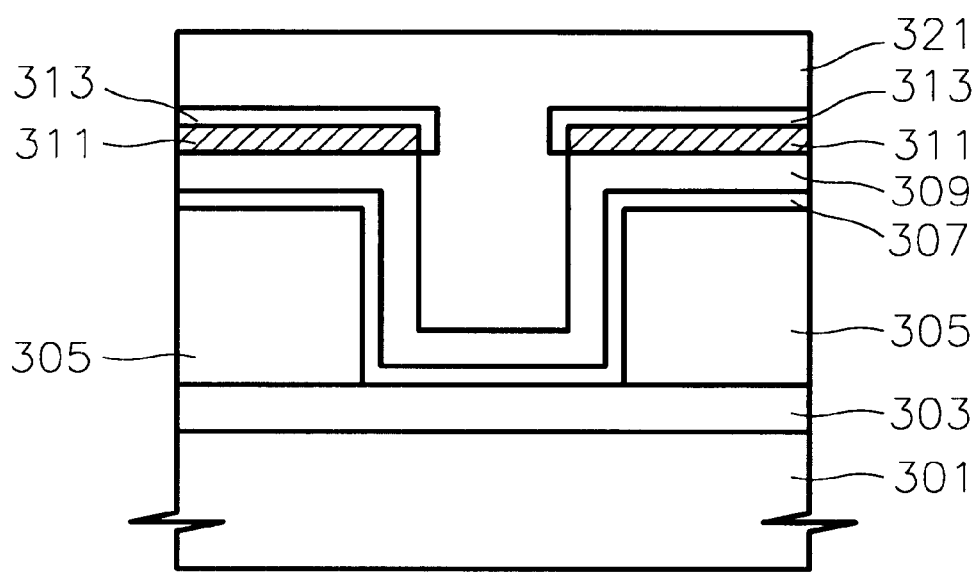

FIGS. 11 through 13 are sectional views for illustrating a method for forming a metal interconnection according to still another embodiment of the present invention and a contact structure according to the present invention.

Referring to FIG. 11, a first conductive layer 303 is formed in a semiconductor substrate 301. An interdielectric layer is formed over the entire surface of the semiconductor substrate 301 where first conductive layer 303 is formed. A predetermined region of the interdielectric layer is etched to form an interdielectric layer pattern 305 having a recessed region 304. The recessed region 304 may be a contact hole for exposing a predetermined region of the first conductive layer 303. In the case where the first conductive layer 303 is a metal layer, the contact hole may be a via hole. In the case where the first conductive layer 303 is an impurity layer, a doped polysilicon layer, an aluminum metal line or a refractory metal silicide layer, the contact hole may be a metal contact hole. A conformal metal layer is formed over the entire surface of the resultant structure having the recessed region. If the recessed region is a via hole, the conformal metal layer is formed by sequentially stacking a wetting layer 307 and a barrier metal layer 309. Here, the conformal metal layer may be either the wetting layer 307 or the barrier metal layer 309. For example, in the case where the first conductive layer 303 is an Al layer or an Al alloy layer and a second conductive layer to be formed in a subsequent process in order to fill the recessed region is also an Al layer or an Al alloy layer, the conformal metal layer is preferably only the wetting layer 307 or is preferably formed by sequentially stacking the wetting layer 307 and the barrier metal layer 309. In the case where the conformal metal layer is only the barrier metal layer 309, ohmic contact does not occur between the first conductive layer 303 and the barrier metal layer 309. And that would increase via contact resistance. Here, the wetting layer 307 is formed of Ti or Ta, and the barrier metal layer 309 is formed of the same material as that described in the first embodiment of the present invention.

In the case where the first conductive layer 303 is a W layer and the second conductive layer is an Al layer or an Al alloy layer, the conformal metal layer is preferably barrier metal layer 309. This is because via contact resistance is increased due to interaction between the W layer and the Al layer if only the wetting layer 307 is interposed therebetween. Therefore, in this case, the conformal metal layer is preferably formed by sequentially stacking the wetting layer 307 and the barrier metal layer 309. Otherwise, the conformal metal layer is preferably only the barrier metal layer 309.

In the case where the contact hole is a metal contact hole, the conformal metal layer is preferably formed by sequentially stacking an ohmic metal layer and a barrier metal layer. Here, the ohmic metal layer may be wetting layer 307. The ohmic metal layer is formed of the same material as that of the wetting layer 307.

An anti-nucleation layer 313 for exposing the conformal metal layer at the sidewalls of and on the bottom of the recessed region is formed on the resultant structure having the conformal metal layer. The anti-nucleation layer 313 and a material layer 311 are formed in the same manner as in the first embodiment of the present invention. Accordingly, the material layer 311 may remain under the anti-nucleation layer 313.

Referring to FIG. 12A, a metal liner 315 is selectively formed on the conformal metal layer not covered by the anti-nucleation layer 313. The metal liner 315 is formed in the same manner as that of the second embodiment of the present invention, that is, selectively MOCVD Al method. A metal layer 317, e.g., an Al layer or an Al alloy layer, is formed on the entire surface of the resultant structure having the metal layer 315 using the PVD method or sputtering method. Here, as shown in FIG. 12A, a void 350 may be formed in the recessed region, which is due to an over-hang phenomenon occurring during the sputtering process. However, the void 350 can be completely filled with the metal layer 317 during a subsequent reflow process. This is because the metal liner 315 serves as a wetting layer.

FIG. 12B is a sectional view illustrating an alternative process for forming a metal plug 316 filling the inside of the recessed region after the metal liner 315 is formed in the recessed region. The metal plug 316 may be subsequentially formed by an alternative process after the anti-nucleation layer 313 is formed without the metal liner 315. The metal plug 316 is formed in the same manner as that of the first embodiment of the present invention. A metal layer 319, e.g., an Al layer or an Al alloy layer, is formed over the entire surface of the resultant structure having the metal plug 316 by a PVD process.

Referring to FIG. 13, the resultant structure having the metal layer (317 or 319 of FIG. 12A or 12B) is annealed at a temperature of 350~° C. as in FIG. 5, thereby forming a second conductive layer 321, that is, a planarized metal alloy layer. Here, the metal liner 315 and/or the metal plug 316 agglomeratecs with the metal layer 317 or 319 to form the second conductive layer 321.

In the case where the contact hole is a via hole in FIGS. 11 through 13, both the metal layer 317 or 319 for forming the second conductive layer 321 and the first conductive layer 303 may be a copper layer. Here, the metal liner 315 of FIG. 12A or the metal plug 316 of FIG. 12B is preferably a copper liner or a copper plug. The copper liner or the copper plug is formed by a selective MOCVD method using a metal source containing copper. In the case where the metal layer 317 or 319 and the first conductive layer 303 are copper layers, the conformal metal layer preferably includes at least one barrier metal layer. This is because copper atoms from the copper layer are susceptible to diffusion into the interdielectric layer pattern or an under layer of the first conductive layer 303. When the first conductive layer 303 may be formed of a copper layer, the copper layer may need a barrier layer to prevent the diffusion of the copper. Also, in the case where the recessed region 304 is used as a metal interconnection line or a wiring line in FIGS. 11 through 13, the interconnection line 317 and 319 for forming the second conductive layer 321 may be a copper layer or an aluminum layer. Here, the metal liner 315 of FIG. 12A or the metal plug 316 of FIG. 12B is preferably a copper or aluminum liner, or a copper or aluminum plug. In the case where the interconnection line 317 or 319 is a copper layer or an aluminum layer, the conformal metal layer is preferably a barrier metal layer, especially for the copper material used in FIGS. 12A through 13.

Referring back to FIG. 13, a contact structure fabricated by the method according to the present invention will now be described.

In FIG. 13, a first conductive layer 303 is formed on a semiconductor substrate 301. An interdielectric layer pattern 305 having a contact hole for exposing a predetermined region of the first conductive layer 303 is formed over the entire surface of the resultant structure having the first conductive layer 303. In the case where the first conductive layer 303 is a lower metal interconnection such as an Al layer, an Al alloy layer or a W layer, the contact hole may be a via hole. Conversely, in the case where the first conductive layer 303 is a conductive layer such as an impurity layer, a doped polysilicon layer or a refractory metal silicide layer, the contact hole may be a metal contact hole.

An anti-nucleation layer 313 for exposing the sidewalls and bottom of the contact hole is formed on the interdielectric layer pattern 305. A conductive layer 311 may be interposed between the anti-nucleation layer 313 and the interdielectric layer pattern 305. The anti-nucleation layer 313 is an insulator layer such as an oxide layer or a nitride layer. The oxide layer may be a metal oxide layer or a silicon oxide layer, and the nitride layer may be a metal nitride layer or a silicon nitride layer. The metal oxide layer is formed by oxidizing a metal layer having excellent oxidation characteristics, for example, an aluminum oxide layer, a titanium oxide layer, a tantalum oxide layer, an yttrium oxide layer, a zirconium oxide layer, a chrome oxide layer, a cobalt oxide layer or a nickel oxide layer. Also, the metal nitride layer may be an insulator layer such as an aluminum nitride layer. Thus, the conductive layer 311 is a partially remaining metal layer for forming the anti-nucleation layer 313, and may be an Al layer, a Ti layer, a Ta layer, a Y layer, a Zr layer, a Cr layer, a Co layer or a Ni layer. A conformal metal layer is interposed between the anti-nucleation layer 313 and the interdielectric layer pattern 305 and is formed on the bottom of and at the side walls of the contact hole. In the case where the conductive layer 311 is disposed under the anti-nucleation layer 313, the conformal metal layer is interposed between the conductive layer 311 and the interdielectric layer pattern 305.

In the case where the contact hole is a via hole, the conformal metal layer has a structure in which a first metal layer 307, a wetting layer, and a second metal layer 309, a barrier metal layer, are sequentially stacked, or the conformal metal layer may be one of the first metal layer 307 and the second metal layer 309. The wetting layer is either a Ti layer or a Ta layer, and the barrier metal layer is a material layer that is the same as the barrier metal layer shown in FIG. 1.

If the contact hole is a metal contact hole, the conformal metal layer has a structure in which the first metal layer 307, an ohmic metal layer, and the second metal layer 309, a barrier metal layer, are sequentially stacked. The ohmic metal layer and the barrier metal layer are the same material layer as those of FIG. 1.

A second conductive layer 321, which fills the inside of the contact hole, not covered by the anti-nucleation layer 313, is formed on the anti-nucleation layer 313. In the case where the contact hole is a via hole, both the first conductive layer 303 and the second conductive layer 321 may be a copper layer. Here, the conformal metal layer preferably includes at least one barrier metal layer. This is because copper atoms from the copper layer are susceptible to diffusion into the interdielectric layer pattern when the copper layer contacts the interdielectric layer pattern. Also, in the case where the contact hole is a metal contact hole, the second conductive layer 321 may be a copper layer. Here, the conformal metal layer also preferably includes at least a barrier metal layer.

According to the described embodiments of the present invention, the anti-nucleation layer for exposing the inside and sidewalls of a contact hole or groove having a high aspect ratio is selectively formed, which thereby completely fills the contact hole or the groove of a highly-integrated semiconductor device. As a result, a metal interconnection can be formed and the reliability of the semiconductor device can be improved.

The invention is not limited to the illustrated embodiment and many changes and modifications can be made within the scope of the invention by a person skilled in the art.

What is claimed is:

1. A method for forming a metal interconnection comprising the steps of:

forming an interdielectric layer on a semiconductor substrate;

etching a predetermined region of the interdielectric layer, thereby forming an interdielectric layer pattern having a recessed region;

forming a barrier metal layer overlying the interdielectric layer pattern;

forming a material layer overlying the barrier metal layer and in regions other than the recessed region;

spontaneously oxidizing the material layer in a vacuum, thereby forming an anti-nucleation layer; and forming a metal layer filling a region adjacent the barrier metal layer in the recessed region.

2. The method of claim 1, further comprising, before the step of forming the barrier metal layer, the step of forming an ohmic metal layer over the interdielectric layer pattern.

3. The method of claim 1, wherein the barrier metal layer is one selected from the group consisting of a titanium nitride layer, a tantalum nitride layer, a TiAlN layer, a TaAlN layer, a TiSiN layer and a TaSiN layer.

4. The method of claim 1, further comprising, before the step of forming the material layer, the step of forming a copper layer over the barrier metal layer.

5. The method of claim 1, wherein the step of forming the material layer comprises the steps of:

loading the semiconductor substrate having the barrier metal layer into a predetermined process chamber of a physical vapor deposition (PVD) apparatus or a chemical vapor deposition (CVD) apparatus having a plurality of process chambers and a transfer chamber; and forming a material layer overlying the barrier metal layer and in regions other than the recessed region, on the semiconductor substrate loaded into the predetermined process chamber.

6. The method of claim 5, wherein the material layer is a metal layer having oxidation characteristics and is one selected from the group consisting of an Al layer, a Ti layer, a Ta layer, a Zr layer, a Sr layer, a Mg layer, a Ba layer, a Ca layer, a Ce layer and a Y layer.

7. The method of claim 5, wherein forming an anti-nucleation layer comprises:

transferring the semiconductor substrate having the material layer to the transfer chamber; and spontaneously oxidizing the material layer by maintaining the transfer chamber at a predetermined vacuum level.

8. The method of claim 7, wherein the predetermined vacuum level is in the range of $10^{-8}$ Torr to 1 atmosphere.

9. A method for forming a metal interconnection comprising the steps of:

forming an interdielectric layer on a semiconductor substrate;

etching a predetermined region of the interdielectric layer, thereby forming a recessed region in the interdielectric layer;

forming a conformal metal layer overlying the interdielectric layer;

spontaneously oxidizing the conformal metal layer in a vacuum, thereby forming an anti-nucleation layer overlying the conformal metal layer and in regions other than bottom of and sidewalls of the recessed region; and forming a metal layer filling a region adjacent the conformal metal layer in the recessed region.

10. The method of claim 9, wherein the recessed region is a via hole for exposing a lower metal interconnection.

11. The method of claim 10, wherein the conformal metal layer is a single layer selected from the group consisting of a wetting layer and a barrier metal layer, or is formed by sequentially stacking the wetting layer and the barrier metal layer.

12. The method of claim 11, wherein the wetting layer is one selected from the group consisting of a titanium layer and a tantalum layer.

13. The method of claim 11, wherein the barrier metal layer is one selected from the group consisting of a titanium nitride layer, a tantalum nitride layer, a TiAlN layer, a TaAlN layer, a TiSiN layer and a TaSiN layer.

14. The method of claim 9, wherein the recessed region is a metal contact hole for exposing an impurity layer, a polysilicon layer or a refractory metal silicide layer.

15. The method of claim 9, wherein the step of forming a metal layer filling a region adjacent the conformal metal layer in the recessed region comprises the steps of:

selectively forming an aluminum liner adjacent the conformal metal layer in the recessed region; and forming a planarized metal layer filling a region adjacent the aluminum liner, on the entire surface of the semiconductor substrate having the aluminum liner.

16. A method for forming a metal interconnection, comprising:

forming an interdielectric layer on a semiconductor substrate;

etching a predetermined region of the interdielectric layer, thereby forming an interdielectric layer pattern having a recessed region;

forming a barrier metal layer overlying the interdielectric layer pattern;

loading the semiconductor substrate having the barrier metal layer into a process chamber of a physical vapor deposition (PVD) apparatus;

forming a material layer overlying the barrier metal layer and in regions other than the recessed region, on the semiconductor substrate loaded into one of the process chambers;

transferring the semiconductor substrate having the material layer to a transfer chamber having a vacuum level;

adjusting the vacuum level of the transfer chamber to spontaneously oxidize the material layer, thereby forming an anti-nucleation layer; and forming a metal layer filling a region adjacent the barrier metal layer in the recessed region.

17. The method of claim 16, wherein the vacuum level is in the range of $10^{-8}$ Torr to 1 atmosphere during the adjusting of the vacuum level.

18. The method of claim 16, further comprising, before forming the barrier metal layer, forming an ohmic metal layer over the interdielectric layer pattern.

19. The method of claim 16, further comprising, before forming a material layer, forming a copper layer over the barrier metal layer.

20. The method of claim 16, wherein the anti-nucleation layer comprises a single atomic layer.

21. The method of claim 16, wherein the anti-nucleation layer is formed without exposing the semiconductor substrate to air or oxygen plasma.

* * * * *

UNITED STATES PATENT AND TRADEMARK OFFICE
CERTIFICATE OF CORRECTION

PATENT NO. : 6,391,769 B1
DATED : May 21, 2002
INVENTOR(S) : Lee et al.

It is certified that error appears in the above-identified patent and that said Letters Patent is hereby corrected as shown below:

Column 10,
Line 31, "(A1203)" should read -- ($Al_2O_3$) --.

Column 11,
Line 27, "100 Torr~10 Torr" should read -- 100 mTorr~10 Torr --.

Column 16,
Line 50, "350~°C" should read -- 350~500°C --.

Signed and Sealed this

Second Day of September, 2003

JAMES E. ROGAN
*Director of the United States Patent and Trademark Office*